United States Patent
Houston

(10) Patent No.: US 7,570,527 B2
(45) Date of Patent: Aug. 4, 2009

(54) STATIC RANDOM-ACCESS MEMORY HAVING REDUCED BIT LINE PRECHARGE VOLTAGE AND METHOD OF OPERATING THE SAME

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 171 days.

(21) Appl. No.: 11/143,038

(22) Filed: Jun. 2, 2005

(65) Prior Publication Data

US 2006/0274587 A1    Dec. 7, 2006

(51) Int. Cl.
    *G11C 7/02* (2006.01)
(52) U.S. Cl. .................... 365/203; 365/154; 365/185.25
(58) Field of Classification Search ................. 365/203, 365/185.25
    See application file for complete search history.

(56) References Cited

U.S. PATENT DOCUMENTS

| | | | | |
|---|---|---|---|---|
| 6,100,748 A * | 8/2000 | Oh | ............................. | 327/526 |
| 6,185,140 B1 * | 2/2001 | Agrawal | ...................... | 365/203 |
| 6,515,893 B1 * | 2/2003 | Bhavnagarwala | ........... | 365/154 |
| 6,751,111 B2 * | 6/2004 | Foss et al. | ..................... | 365/49 |
| 6,819,612 B1 * | 11/2004 | Achter | ........................ | 365/205 |
| 6,888,768 B2 * | 5/2005 | Sugio | .......................... | 365/203 |
| 6,901,016 B2 * | 5/2005 | Miyashita et al. | ........... | 365/203 |
| 2003/0202405 A1 * | 10/2003 | Shau | ........................... | 365/200 |
| 2004/0001378 A1 * | 1/2004 | Madan et al. | ................ | 365/202 |
| 2004/0095171 A1 * | 5/2004 | Kang | ........................... | 327/143 |
| 2004/0159905 A1 * | 8/2004 | Sato | ............................ | 257/506 |
| 2005/0162894 A1 * | 7/2005 | Itoh et al. | .................... | 365/149 |

\* cited by examiner

*Primary Examiner*—Hoai V Ho
*Assistant Examiner*—Anthan T Tran
(74) *Attorney, Agent, or Firm*—Rose Alyssa Keagy; Wade J. Brady, III; Frederick J. Telecky, Jr.

(57) ABSTRACT

A bit line precharge circuit, a method of precharging a bit line and an SRAM device incorporating the circuit or the method. In one embodiment, the bit line precharge circuit includes: (1) a word line driver coupled to word lines of the SRAM array and configured to operate at a word line driver voltage and (2) a bit line precharge circuit coupled to bit lines of the SRAM array and configured to precharge the bit lines to a precharge voltage substantially lower than the word line driver voltage.

22 Claims, 3 Drawing Sheets

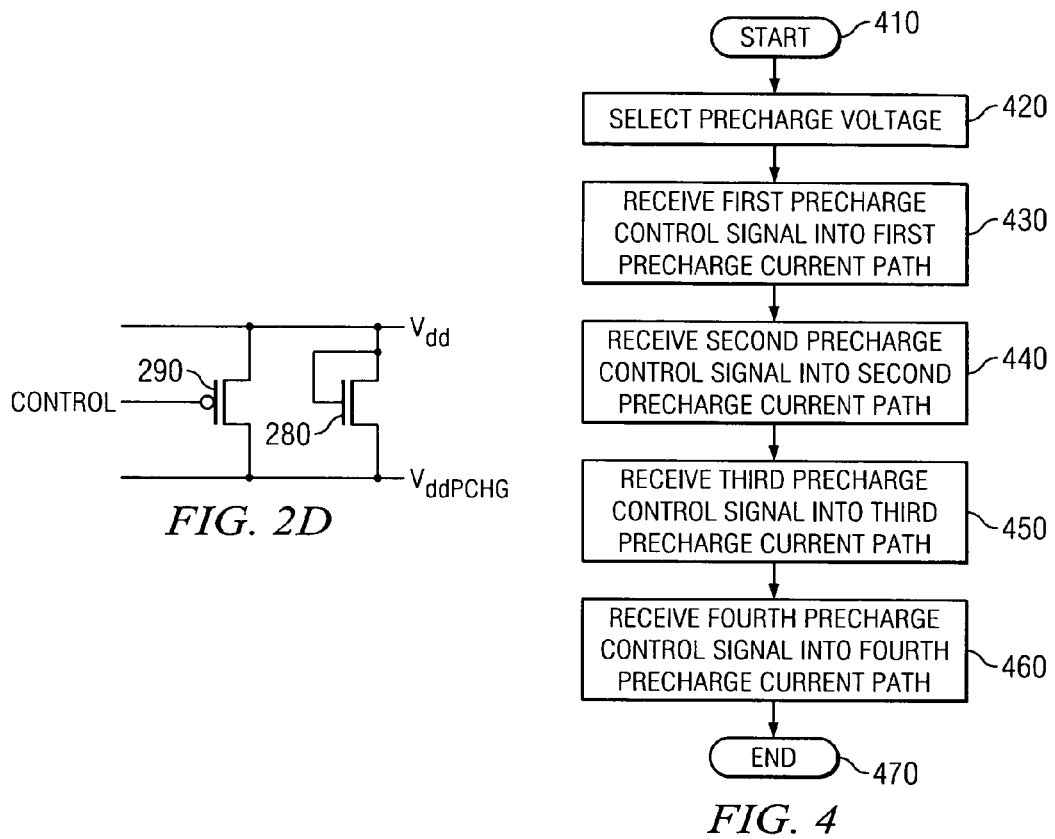
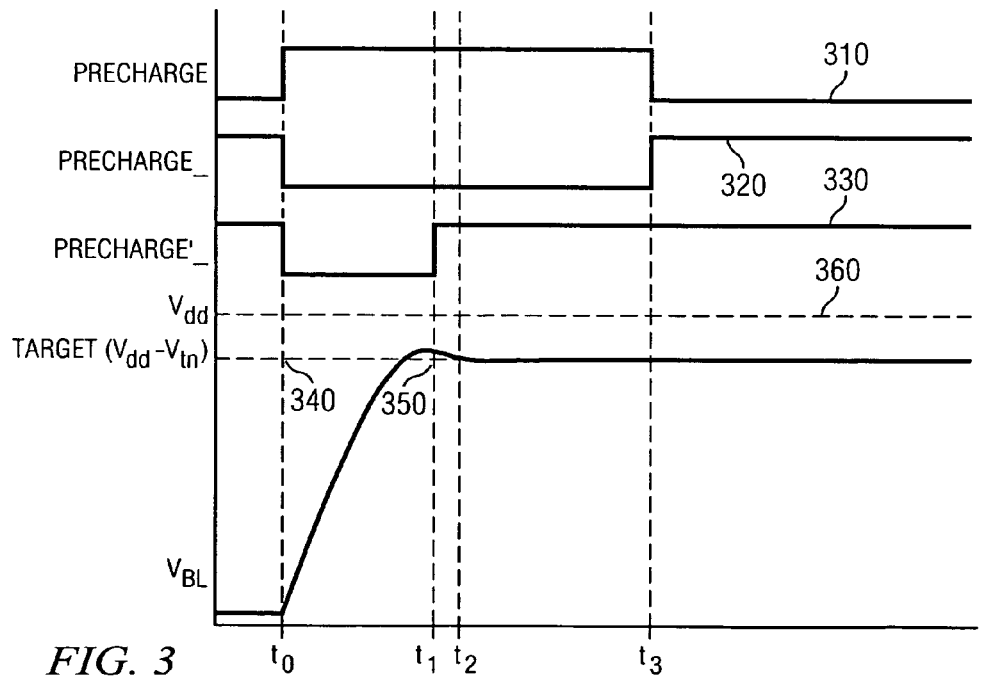

STATIC RANDOM-ACCESS MEMORY HAVING REDUCED BIT LINE PRECHARGE VOLTAGE AND METHOD OF OPERATING THE SAME

TECHNICAL FIELD OF THE INVENTION

The present invention is directed, in general, to static random-access memory (SRAM) and, more specifically, to SRAM having a reduced bit line precharge voltage and a method of precharging a bit line at a reduced voltage.

BACKGROUND OF THE INVENTION

Different types of memory are used in electronic apparatus for various purposes. Read-only memory (ROM) and random-access memory (RAM) are two such types of memory commonly used within computers for different memory functions. ROM retains its stored data when power is switched off and therefore is often employed to store programs that are needed for powering-up an apparatus. ROM, however, does not accommodate writing. RAM, on the other hand, allows data to be written to or read from selected addresses associated with memory cells and, therefore, is typically used during normal operation of the apparatus.

Two common types of RAM are dynamic RAM (DRAM) and static RAM (SRAM). DRAM is typically used for the main memory of computers or other electronic apparatuses since, though it must be refreshed, it is typically inexpensive and requires less chip space than SRAM. Though more expensive and space-consumptive, SRAM does not require refresh, making it faster. These attributes make SRAM devices particularly desirable for portable equipment, such as laptop computers and personal digital assistants (PDAs).

A typical SRAM device includes an array of addressable memory cells arranged in columns and rows. A typical SRAM cell includes two access transistors and a flip-flop formed with two cross-coupled inverters. Each inverter has a pull-down (driver) and a pull-up (load) transistor. The gates of the access transistors in each row are connected to a word line and the sources of each of the access transistors in each column are connected to either one of a bit line pair, BL or BL_. Peripheral circuitry associated with the rows (or word lines) and peripheral circuitry associated with the columns (or bit lines) facilitate reading data from, and writing data to, the SRAM cells.

Generally, to read data from an SRAM cell, a word line driver activates a word line according to an address decoded by a row decoder and received via a signal path that typically includes an address bus connected to the SRAM device. The access transistors turn on and connect the outputs of the flip-flop to the bit line pair sending signals representing the data in the SRAM cell to a sense amplifier coupled to the bit line pair. The sense amplifier produces a logical 0 or 1 from the potential difference on the bit line pair, which is, in turn, provided to external circuitry of the associated electronic apparatus, perhaps through a buffer.

Two considerations govern SRAM device design with respect the way in which reads are performed. First, the contents of the SRAM cells must survive being read. By virtue of their length, bit lines have significant capacitance and resistance. Charging the bit lines must not overwhelm the small currents and voltages within an SRAM cell that encode its contents. Otherwise, the contents may become corrupt.

Second, the read ought to be performed as quickly as possible to increase the overall speed of the SRAM device. Sense amplifiers increase read speed by detecting bit line voltages more quickly. The bit lines are precharged and equalized to support a faster read without upsetting the SRAM cell.

These two design considerations must be balanced in selecting the correct voltage at which to precharge the bit lines. However, selecting the proper bit line precharge voltage to use with respect to an SRAM device is a matter of tradeoff. The lower that the bit line precharge voltage is, the better that quiescent current (IDDQ) and static noise margin (SNM) characteristics of the SRAM device tend to be.

Notwithstanding this fact, lowering the bit line precharge voltage below a certain point also causes SNM to degrade. Further, the lower that the bit line precharge voltage is, the lower read current (Iread) is, particularly at a low word line driver (metal-oxide semiconductor, or MOS, drain) voltages ($V_{dd}$) . Also, with a lower bit line precharge voltage, the gate-source voltage ($V_{gs}$) on the p-channel transistors contained in the precharge circuit is reduced, resulting in a longer bit line precharge time.

Accordingly, what is needed in the art is a better way to precharge bit lines. What is also needed in the art is a circuit that yields faster bit line precharging.

SUMMARY OF THE INVENTION

To address the above-discussed deficiencies of the prior art, one aspect of the present invention provides a bit line precharge circuit. In one embodiment, the bit line precharge circuit includes: (1) a word line driver coupled to word lines of the SRAM array and configured to operate at a word line driver voltage and (2) a bit line precharge circuit coupled to bit lines of the SPAM array and configured to precharge the bit lines to a precharge voltage substantially lower than the word line driver voltage.

In another aspect, the present invention provides a method of precharging bit lines in an SRAM array. In one embodiment, the method includes: (1) operating a word line driver coupled to word lines of the SRAM array at a word line driver voltage and (2) precharging bit lines of the SRAM array to a precharge voltage substantially lower than the word line driver voltage.

In yet another aspect, the present invention provides an integrated circuit that includes an SRAM array having word lines and bit lines. The SRAM array has a bit line precharge circuit including: (1) a word line driver coupled to word lines of the SRAM array and configured to operate at a word line driver voltage and (2) a bit line precharge circuit coupled to lines to a precharge voltage substantially lower than the word line driver voltage.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the invention, reference is now made to the following descriptions taken in conjunction with the accompanying drawing, in which:

FIG. 2D illustrates one embodiment of a circuit configured to provide a changing precharge voltage to the circuits of FIGS. 2A, 2B or 2C;

FIG. 3 illustrates a graph showing precharge control signals and a resulting bit line voltage; and FIG. 4 illustrates a flow diagram of one embodiment of method of precharging a bit line carried out according to the principles of the present invention.

DETAILED DESCRIPTION

Figure 1:
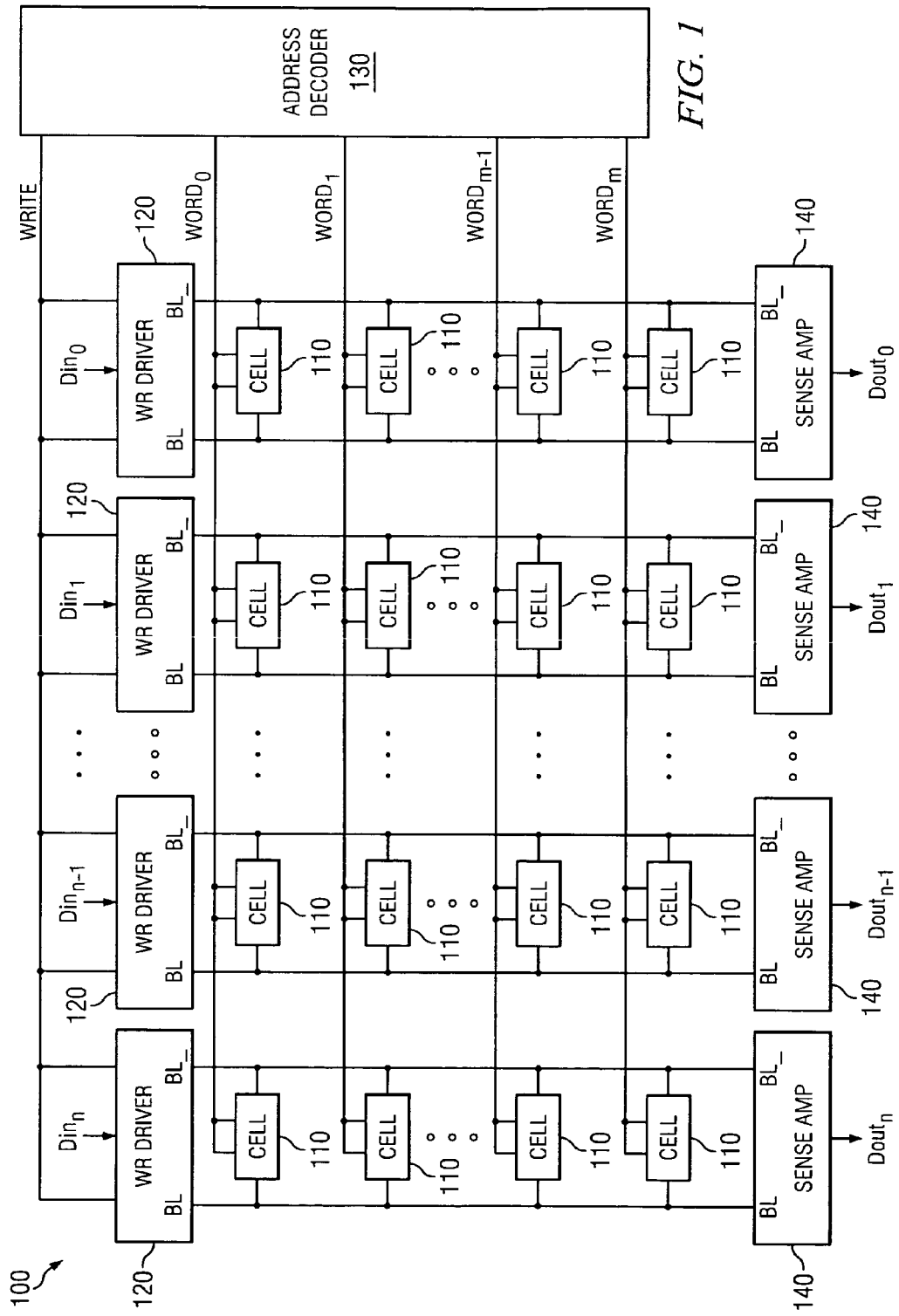
FIG. 1 illustrates a block diagram of one embodiment of an integrated circuit containing an SRAM device having an SRAM array and a bit line precharge circuit constructed according to the principles of the present invention.

Referring initially to FIG. 1, illustrated is a block diagram of one embodiment of an integrated circuit containing an SRAM device having a bit line precharge circuit constructed according to the principles of the present invention. The SRAM device, generally designated 100, includes an array of addressable memory cells 110 arranged in columns and rows. For purposes of the present discussion, each SRAM cell 110 will be assumed to be conventional in construction and operation.

Each SRAM cell 110 includes two access transistors and a flip-flop formed with two cross-coupled inverters (not shown, but well known to those skilled in the art). Each inverter has a pull-down (driver) and a pull-up (load) transistor. The gates of the access transistors in each row are connected to a word line (e.g., $Word_0$, $Word_1$, ... $Word_{m-1}$, $Word_m$). The sources of each of the access transistors in each column are connected to either one of a bit line BL or a complementary bit line BL_. Peripheral circuitry associated with the rows (or word lines) and peripheral circuitry associated with the columns (or bit lines) facilitate reading data from, and writing data to, the SRAM cells 110. Sense amplifiers 140 produce a logical 0s or 1s from the potential difference on the bit lines. The sense amplifiers 140 in turn provide the logical 0s or 1s ($Dout_0$, $Dout_1$, ... $Dout_{N-1}$, $Dout_N$) to external circuitry of the associated electronic apparatus, perhaps through a buffer.

A conventional "6T" SRAM cell has two n-channel access transistors connecting the bit lines, BL and $BL_{13}$, to cross-coupled inverters that form a latch. To be able to write into the cell, the access transistors are designed to be stronger than the inverter pull-up (load) transistors so that the high side of the latch can be pulled low by one or the other of the bit lines through their respective access transistors. To prevent upset of the cell on read, the access transistor is designed to be weaker than the inverter pull down (driver) transistor so that the low side of the latch is not pulled high by the bit line through the access transistor. Thus the cell is not upset during a read if the bit lines are precharged high. If the bit lines are precharged more that a $V_{tn}$ of the access transistor below the write line voltage, the high side of the latch will start to be pulled low, and the cell will be increasingly subject to upset. Therefore, the conventional procedure has been to precharge the bit lines to substantially the same voltage as the high supply voltage to the word line driver. (The word line driver high supply voltage will be referred to herein as the word line driver voltage.) However, even though the cell is designed to have the driver transistor stronger than the access transistor, the low side will be pulled up somewhat by a high bit line when the word line voltage is high. As the low side of the latch is pulled up to around the threshold voltage of the high side driver, $V_{tn}$, the cell becomes subject to upset. Since the driver and the access transistors act as a voltage divider between the bit line and the low supply voltage to the latch, the higher the voltage of the bit line the higher the low side of the latch is pulled, and the less stable the cell.

The present invention recognizes that the optimum bit line precharge voltage for cell stability lies somewhere between $V_{dd}$ and $V_{dd}$-$V_{tn}$, where $V_{dd}$ is the word line driver voltage and $V_{tn}$ is the access transistor threshold voltage. Lowering the precharge voltage below $V_{dd}$ also has the benefit of lower leakage current (IDDQ). Lowering the bit line precharge voltage is more important at relatively high $V_{dd}$, both for cell stability and for IDDQ.

It is also true that precharging the bit lines to $V_{dd}$ gives the greatest read current (current from the cell pulling the bit line low). Inadequate read current is most apt to be a problem at low $V_{dd}$, so it is less desirable to lower bit line precharge for low $V_{dd}$ than for high $V_{dd}$. The speed of precharge is also an issue with lowered bit line precharge voltage because of reduced precharge current for the same size precharge transistors.

Referring again to FIG. 1, a precharge control signal, Precharge_ (and/or its inverted form, Precharge), is provided to a bit line precharge circuit (not shown in FIG. 1, but proximate the write drivers 120). (Normally, a line or signal is regarded as active in its high or logical 1 state. A trailing underscore in a line or signal name indicates herein that the line or signal is instead regarded as active in its low or logical 0 state.)

Precharge_ causes the bit lines to be precharged before a read takes place. The illustrated embodiment of the present invention introduces a second precharge control signal, Precharge'_ in addition to Precharge_. Although FIG. 1 does not show a bit line precharge circuit, Precharge_ or Precharge'_, FIG. 2A does and will now be described.

Figure 2A:
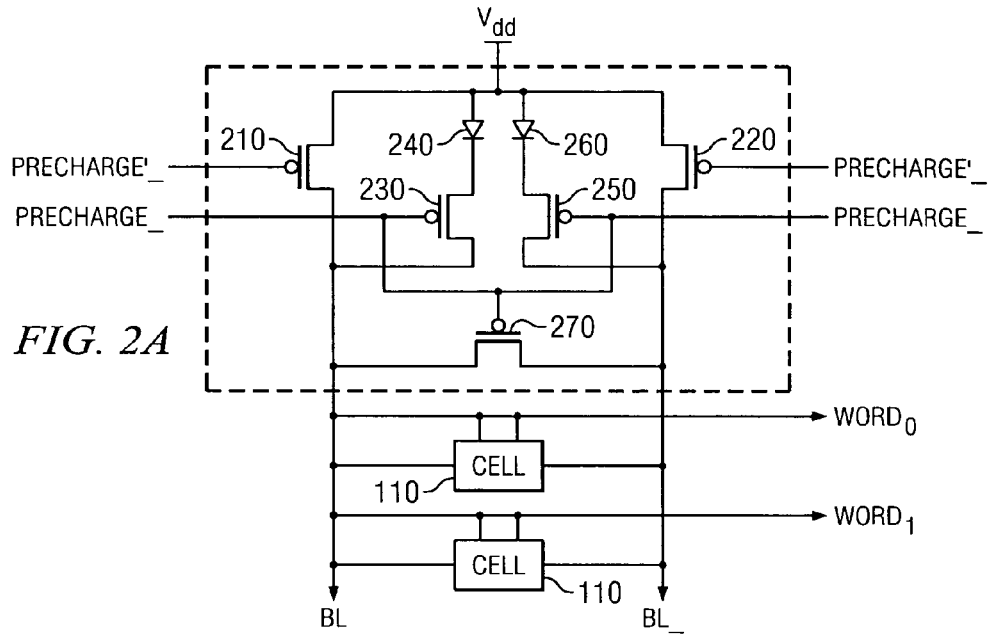
FIG. 2A illustrates a schematic and block diagram of a portion of the SRAM array of FIG. 1 showing, in particular, a first alternative embodiment of a bit line precharge circuit configured to apply a changing precharge voltage to a bit line in the SRAM array.

Turning now to FIG. 2A, illustrated is a schematic and block diagram of a portion of the SRAM array of FIG. 1 showing, in particular, a first alternative embodiment of a bit line precharge circuit configured to apply a changing precharge voltage to a bit line in the SRAM array. Shown are two SRAM cells 110 and respective bit lines, BL and BL_. The bit line precharge circuit is designed to make bit line precharge voltage relative to $V_{dd}$ a function of $V_{dd}$ such that $V_{dd}$-$V_{BL}$ is larger when $V_{dd}$ is higher.

The bit line precharge circuit is coupled to the bit line BL and the complementary bit line BL_. The bit line precharge circuit includes a first precharge current path coupled between a precharge voltage source $V_{dd}$ and the bit line BL. In the illustrated embodiment, the first precharge current path includes a p-channel transistor 230 and a diode 240. The p-channel transistor 230 is configured to receive a first precharge control signal, Precharge_, of a first duration. The diode 240 provides a voltage drop.

The bit line precharge circuit also includes a second precharge current path coupled between the precharge voltage source $V_{dd}$ and the bit line BL. In the illustrated embodiment, the second precharge current path includes a p-channel transistor 210. The p-channel transistor 210 is configured to receive a second precharge control signal, Precharge'_, of a second duration shorter than the duration of the first precharge control signal, Precharge_ (the "first duration").

In the illustrated embodiment, the bit line precharge circuit includes a third precharge current path coupled between the precharge voltage source $V_{dd}$ and the complementary bit line BL_. In the illustrated embodiment, the third precharge current path includes a p-channel transistor 250 and a diode 260. The p-channel transistor 250 is configured to receive the first precharge control signal, Precharge_. The diode 240 provides a voltage drop.

In the illustrated embodiment, the bit line precharge circuit also includes a fourth precharge current path coupled between the precharge voltage source $V_{dd}$ and the complementary bit line BL_. In the illustrated embodiment, the fourth precharge current path includes a p-channel transistor 220. The p-channel transistor 220 is configured to receive the second precharge control signal, Precharge'_.

An equalizing transistor 270 straddles the bit line BL and the complementary bit line BL_, ensuring that the voltages of the two bit lines are equalized. The equalizing transistor 270 is closed only during a precharge and is otherwise open.

Figure 2B:
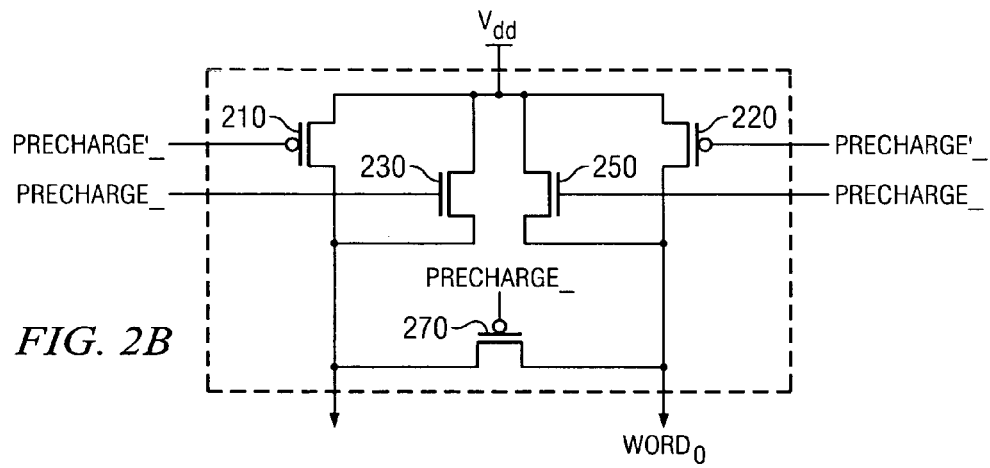
FIG. 2B illustrates a second alternative embodiment of a bit line precharge circuit configured to apply a changing precharge voltage to a bit line in the SRAM array.

Turning now to FIG. 2B, illustrated is a second alternative embodiment of a bit line precharge circuit configured to apply a changing precharge voltage to a bit line in the SRAM array. The bit line precharge circuit of FIG. 2B is similar to the bit line precharge circuit of FIG. 2A, except the transistors 230, 250 are now n-channel transistors driven by Precharge, which is the inverted form of Precharge_. The intrinsic impedances of the n-channel transistors 230, 250 provide the voltage drop in the first and third conductive paths.

Figure 2C:
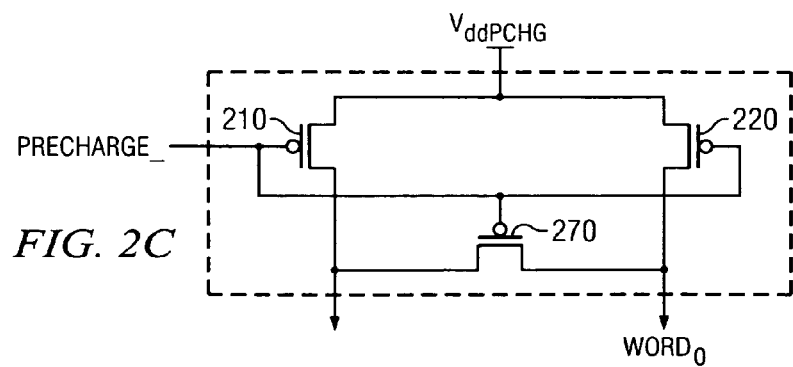
FIG. 2C illustrates a third alternative embodiment of a bit line precharge circuit configured to apply a changing precharge voltage to a bit line in the SRAM array.

Turning now to FIG. 2C, illustrated is a third alternative embodiment of a bit line precharge circuit configured to apply a changing precharge voltage to a bit line in the SRAM array. The bit line precharge circuit of FIG. 2C is simpler than the bit line precharge circuits of FIGS. 2A and 2B. The precharge voltage source is no longer $V_{dd}$, but instead a voltage, $V_{ddPCHG}$ that can be supplied by any of a variety of ways, including the circuit of FIG. 2D that will be described below. Other ways include a voltage regulator or an off-chip power supply. $V_{ddPCHG}$ can be a fixed or variable off-set from $V_{dd}$. The off-set can be selected by a control signal that is generated on chip or input from off-chip. For example, $V_{ddPCHG}$ could be set to $V_{dd}$-$V_{tn}$ for a high voltage screening test and then set to $V_{dd}$ for normal operation. Alternatively, $V_{ddPCHG}$ could be set to $V_{dd}$-$V_{tn}$ for normal operation and set to $V_{dd}$ for low voltage operation. $V_{ddPCHG}$ could be set to $V_{dd}$ for relatively high frequency operation and to $V_{dd}$-$V_{tn}$ for relatively low frequency operation. In the above, $V_{ddPCHG}$ could be set to voltages other than $V_{dd}$ or $V_{dd}$-$V_{tn}$. The p-transistors 210, 220 and the equalizing transistor 270 are driven by Precharge_.

Turning now to FIG. 2D, illustrated is one embodiment of a circuit configured to provide a changing precharge voltage to the circuits of FIGS. 2A, 2B or 2C. More specifically, the circuit is configured to provide $V_{ddPCHG}$, which is the changing precharge voltage source employed in FIG. 2C. An n-channel transistor 280 provides a voltage drop of $V_{tn}$. A p-channel transistor 290 receives a control signal that closes or opens the p-channel transistor 290. When the p-channel transistor is open, $V_{ddPCHG}$ approximately=$V_{dd}$-$V_{tn}$. The n-channel transistor 280 with gate connected to drain acts as a diode that will clamp the voltage drop to approximately $V_{tn}$, the threshold voltage of 280. Transistors with the gate tied to drain, as for 280, are generally referred to as diode connected transistors, or simply as diodes. When the p-channel transistor is closed, $V_{ddPCHG}$ approximately equals $V_{dd}$. The control signal may originate off-chip or be generated on chip. The control signal may be set by programmable input or fuse selection. Alternative voltage drop elements may be used in place of the diode connected n-channel transistor 280, such as a diode connected p-channel transistor or a low-drop-out (LDO) voltage regulator. Also, different widths and lengths or channel dopings of the n-channel transistor 280 can be used to give different offsets of $V_{ddPCH}$ relative to $V_{dd}$. The circuit of FIG. 2D may be expanded to include multiple voltage drop options that can be selected by control signal.

Having described the structure of three embodiments of a bit line precharge circuit, its operation will now be described. Accordingly, turning now to FIG. 3, illustrated is a graph showing precharge control signals and a resulting bit line voltage.

The graph is one of voltage as a function of time and compares Precharge 310, Precharge_ 320, Precharge_ 330, a target BL voltage, "Target," 340 at which precharging is deemed complete, actual BL voltage, a $V_{BL}$ curve 350 assuming the bit line precharge circuit of the present invention and a $V_{BL}$ curve 360 assuming a prior art bit line circuit.

At time $t_0$, Precharge 310, Precharge_ 320 and Precharge'_ 330 are asserted. In response, $V_{BL}$ begins to rise toward $V_{dd}$. At time $t_1$, Precharge'_ 330 is deasserted. Were Precharge'_ 330 to continue to be asserted, the second precharge current path would continue to precharge $V_{BL}$ toward $V_{dd}$ 360. However, since Precharge'_ 330 is deasserted at $t_1$, only the first precharge path continues to precharge $V_{BL}$. Since the first precharge path contains a voltage drop (e.g., diode drop), $V_{BL}$ is precharged only toward Target 340, in this case $V_{dd}$ minus the voltage drop from the diode (about 0.4V to about 0.5V). The curve 350 shows this to be the case.

Although Precharge'_ 330 is deasserted at $t_1$, $V_{BL}$ may continue to rise briefly before settling back to Target 340 at $t_2$. Again, the curve 350 is seen to exceed Target 340 for a brief interval ($t_2$-$t_1$) before reaching Target 340. Alternatively, $t_1$ can be adjusted such that Precharge'_ goes high before $V_{BL}$ exceeds the target.

Further, Target 340 may advantageously be chosen as a function of $V_{dd}$. Advantageously, $V_{dd}$—Target is greater when $V_{dd}$ is relatively higher than when $V_{dd}$ is relatively low. The result is that $V_{dd}$ can be allowed to be higher with less increase in IDDQ and less risk of upsetting the cells in the SRAM array by reason of an excessive $V_{BL}$. Further, faster precharge and less reduction in read current can be attained when $V_{dd}$ is relatively low. Since the current through the voltage drop element will be larger at high $V_{dd}$, there will be some self-adjustment of the voltage drop as a function of $V_{dd}$ if the voltage drop across the voltage drop element is a function of the current, such as for a resistor or a diode. Alternatively, the voltage drop, or selection between a voltage drop and no voltage drop, can be selected by a control signal.

Turning now to FIG. 4, illustrated is a flow diagram of one embodiment of a method of precharging a bit line carried out according to the principles of the present invention.

In a start step 410, it is desired to precharge a bit line and a complementary bit line. With respect to the bit line, in a step 420, an appropriate precharge voltage is selected and advantageously in accordance with the various embodiments described above. In a step 430, a first precharge control signal of a first duration is received into a first precharge current path coupled between a precharge voltage source and the bit line. In a step 440, a second precharge control signal of a second duration shorter than the first duration is received into a second precharge current path coupled between the precharge voltage source and the bit line.

With respect to the complementary bit line, in a step 450, the first precharge control signal is received into a third precharge current path coupled between the precharge voltage source and a complementary bit line. In a step 460, the second precharge control signal is received into a fourth precharge current path coupled between the precharge voltage source and the complementary bit line. The method ends in an end step 470.

Although the present invention has been described in detail, those skilled in the art should understand that they can make various changes, substitutions and alterations herein without departing from the spirit and scope of the invention in its broadest form.

What is claimed is:

1. A bit line precharge circuit for a static random-access memory array having word lines and bit lines and comprising:
   a word line driver coupled to said word lines of said static random-access memory array and configured to operate at a word line driver voltage; and
   said bit line precharge circuit coupled to said bit lines and configured to precharge said bit lines to a precharge voltage substantially lower than said word line drive voltage; wherein said bit line precharge circuit employs a first precharge current path coupled between a precharge voltage source and one of said bit lines, said first precharge current path being configured to receive a first precharge control signal of a first duration, and said precharge circuit further employs a second precharge current path coupled between said precharge voltage source and said one of said bit lines and configured to receive a second precharge control signal of a second duration shorter than said first duration.

2. The precharge circuit as recited in claim 1 wherein said first precharge control signal and said second precharge control signal begin substantially simultaneously.

3. The precharge circuit as recited in claim 1 further comprising:
   a third precharge current path coupled between said precharge voltage source and a complementary bit line, having a voltage drop associated therewith and configured to receive said first precharge control signal; and
   a fourth precharge current path coupled between said precharge voltage source and said complementary bit line and configured to receive said second precharge control signal.

4. The precharge circuit as recited in claim 1 wherein said first precharge current path includes a diode configured to create said voltage drop.

5. The precharge circuit as recited in claim 1 wherein said precharge voltage is provided by one selected from the group consisting of:
   a voltage regulator, and
   an n-channel transistor configured to receive said word line driver voltage.

6. The precharge circuit as recited in claim 1 wherein a difference between said word line driver voltage and said precharge voltage increases as said word line driver voltage increases.

7. A method of precharging bit lines in a static random-access memory array having word lines and bit lines and comprising:
   operating a word line driver coupled to said word lines of said static random-access memory array at a word line driver voltage; and
   precharging said bit lines to a precharge voltage substantially lower than said word line driver voltage; wherein said precharging comprises employing a first precharge current path to precharge one of said bit lines, said first precharge current path coupled between a precharge voltage source and said one of said bit lines to receive a first precharge control signal of a first duration, and said method further comprising employing a second precharge current path coupled between said precharge voltage source and said one of said bit lines to receive a second precharge control signal of a second duration shorter than said first duration.

8. The method as recited in claim 7 wherein said first precharge control signal and said second precharge control signal begin substantially simultaneously.

9. The method as recited in claim 7 wherein said precharging further comprises:
   employing a third precharge current path coupled between said precharge voltage source and a complementary bit line, having a voltage drop associated therewith and configured to receive said first precharge control signal; and
   employing a fourth precharge current path coupled between said precharge voltage source and said complementary bit line and configured to receive said second precharge control signal.

10. The method as recited in claim 7 wherein said first precharge current path includes a diode configured to create said voltage drop.

11. The method as recited in claim 7 wherein said precharge voltage is set by one selected from the group consisting of:
   a programmable input,
   an input signal, and
   a fuse setting.

12. The method as recited in claim 7 wherein said precharge voltage is lower than said word line driver voltage by about an access transistor threshold voltage.

13. The method as recited in claim 7 wherein said precharge voltage is provided by one selected from the group consisting of:
   a voltage regulator, and
   an n-channel transistor configured to receive said word line driver voltage.

14. The method as recited in claim 7 further comprising increasing a difference between said word line driver voltage and said precharge voltage as said word line driver voltage increases.

15. An integrated circuit comprising a SRAM device including:
   an SRAM array having a plurality of SRAM cells coupled to word lines and bit lines; and
   a bit line precharge circuit, including:
   a word line driver coupled to said word lines and configured to operate at a word line driver voltage, and
   said bit line precharge circuit coupled to said bit lines and configured to precharge said bit lines to a precharge voltage substantially lower than said word line driver voltage; wherein said bit line precharge circuit employs a first precharge current path coupled between a precharge voltage source and one of said bit lines, said first precharge current path being configured to receive a first precharge control signal of a first duration, and said precharge circuit further employs a second precharge current path coupled between said precharge voltage source and said one of said bit lines and configured to receive a second precharge control signal of a second duration shorter than said first duration.

16. The integrated circuit as recited in claim 15 wherein said first precharge control signal and said second precharge control signal begin substantially simultaneously.

17. The integrated circuit as recited in claim 15 wherein said bit line precharge circuit further includes:
- a third precharge current path coupled between said precharge voltage source and a complementary bit line, having a voltage drop associated therewith and configured to receive said first precharge control signal; and
- a fourth precharge current path coupled between said precharge voltage source and said complementary bit line and configured to receive said second precharge control signal.

18. The integrated circuit as recited in claim 15 wherein said first precharge current path includes a diode configured to create said voltage drop.

19. The integrated circuit as recited in claim 15 wherein said precharge voltage is set by one selected from the group consisting of:
- a programmable input,
- an input signal, and
- a fuse setting.

20. The integrated circuit as recited in claim 15 wherein said precharge voltage is lower than said word line driver voltage by about an access transistor threshold voltage.

21. The integrated circuit as recited in claim 15 wherein said precharge voltage is provided by one selected from the group consisting of:
- a voltage regulator, and
- an n-channel transistor configured to receive said word line driver voltage.

22. The integrated circuit as recited in claim 15 wherein a difference between said word line driver voltage and said precharge voltage increases as said word line driver voltage increases.

* * * * *

UNITED STATES PATENT AND TRADEMARK OFFICE
CERTIFICATE OF CORRECTION

PATENT NO. : 7,570,527 B2  Page 1 of 1
APPLICATION NO. : 11/143038
DATED : August 4, 2009
INVENTOR(S) : Theodore W. Houston It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 209 days.

Signed and Sealed this

Seventh Day of September, 2010

David J. Kappos
*Director of the United States Patent and Trademark Office*